United States Patent [19]
Nagano et al.

[11] Patent Number: 6,133,798
[45] Date of Patent: Oct. 17, 2000

[54] OSCILLATION SYSTEM

[75] Inventors: Seido Nagano; Jaw-Shen Tsai, both of Tokyo, Japan

[73] Assignee: NEC Corporation, Tokyo, Japan

[21] Appl. No.: 09/328,716

[22] Filed: Jun. 9, 1999

[30]       Foreign Application Priority Data

| Jun. 19, 1998 | [JP] | Japan | ................................. 10-173187 |
| Mar. 17, 1999 | [JP] | Japan | ................................. 11-071156 |

[51] Int. Cl.[7] .............................. H03B 5/00; H03B 5/12; H03B 5/18
[52] U.S. Cl. ........................ 331/55; 331/107 T; 331/172; 331/173; 331/177 R; 331/96
[58] Field of Search .......................... 331/55, 96, 107 T, 331/107 DP, 107 SL, 107 P, 117 R, 117 FE, 117 D, 172–174, 177 R

[56]                References Cited

U.S. PATENT DOCUMENTS 3,967,210   6/1976   Aumann ..................................... 331/56
5,485,164   1/1996   Compton et al. ................. 343/700 MS
5,592,127   1/1997   Mizuno ..................................... 331/57
5,943,660   8/1999   Yesildirek et al. ....................... 706/10

OTHER PUBLICATIONS

J.G. Maneatis, FA 8.1: "Low–Jitter and Process–Independent DLL and PLL Based on Self–Biased Techniques", ISSCC96/Session 8/Digital Clocks and Latches, 2 pages.

*Primary Examiner*—David Mis
*Attorney, Agent, or Firm*—Ostrolenk, Faber, Gerb & Soffen, LLP

[57]                ABSTRACT

In plural oscillation systems each of which can be described by the van der Pol equation, each oscillation system is reciprocally connected with at least one oscillation system other than the own oscillation system by a coupling factor to realize automatically the phenomenon of synchronization of the respective oscillation systems to enable spontaneous tuning of the entire system. A self-excited oscillation of an oscillation system prescribed by a van der Pol equation is controlled on/off by varying an applied voltage as a variable.

27 Claims, 12 Drawing Sheets

OSCILLATION SYSTEM

TECHNICAL FIELD

This invention relates generally to an oscillation system, and more particularly, to a system in which plural oscillation systems are set into synchronous oscillations and to a self-excited oscillation control system which renders it possible to control the state of oscillation in the self-excited oscillation system.

BACKGROUND ART

In a number of current artificial system, information processing and its operations are carried out in accordance with timing steps synchronized with clock signals. In keeping up with the tendency towards an enlarged scale, diversification and networking of systems, an entire system is made up of a set of plural sub-systems, such that more and more importance is attached to the synchronization technique between these sub-systems.

There are a number of fields for application of the synchronization technique, such as large scale integrated circuits (system-on-chips), communication systems inclusive of the Internet, power systems, parallel processing systems and microwave oscillation systems. As a principle, the synchronization technique may be grasped as being the common technique used for synchronization among plural sub-systems.

In a large-scale integrated circuit, for example, a phase locked loop (PLL) or a delay locked loop (DLL) is built on a chip and external clocks are distributed to sub-circuits provided on the chip to realise synchronization among the sub-circuits, as stated in 1996 IEEE ISSCC Proc. (IEEE 1996).

With the increasing scale of the integrated circuits, and with the increasing processing speed, that is clock frequency, difficulties met in clock distribution and phase synchronization designing techniques are increasing. That is, in distributing high-quality high-speed pulse signals to a fine high-density structure over a wide range, increasing energy consumption, lowering in reliability, such as in signal value, timing, lowering in frequency margin etc, overhead due to increasing complexity of the synchronization circuit and increasing difficulties in designing due to the increasing circuit scale, are presenting serious problems. This is the problem common to the above-described diversified fields of application of the integrated circuit.

With regard to an oscillation system, variety of different circuits of a self-excited oscillation system, are known up to now.

The self-excited oscillation system is a system in which oscillations are excited therein on application of a pre-set energy thereto, and may be frequently seen in a fractional oscillation system or an electric oscillation circuit. One of the well-known examples of the self-excited oscillation systems is the van der Pol circuit.

However, with the conventional self-excited oscillation systems, oscillations are self started for any external inputs, as the name implies, with the oscillations, once started, being unable to be terminated. In this sense, there lacks in the conventional self-excited oscillation systems a switching function adapted to control the oscillation on/off. Thus, it is impossible to on/off control the self-excited oscillation of a self-excited oscillation system under a pre-set external input.

SUMMARY OF THE DISCLOSURE

Accordingly, it is an object of the present invention to provide a synchronization system wherein, in realization of synchronization among different sub-systems, a synchronization can be realized automatically for spontaneously tuning the overall system.

It is still another object of the present invention to provide a self-excited oscillation system in which the oscillation on/off switching function can be easily assembled by employing a pre-set parameter as a control signal.

To achieve the above objects, in accordance with the the present invention, a synchronization system is provided that is compressed of a plurality of oscillation systems, the system operation of which is prescribed by the following van der Pol equation:

$$d^2x_j/dt^2 - \epsilon(1-x_j^2)dx_j/dt + x_j = 0$$

where x, t and $\epsilon$ denote a variable, time and a parameter, respectively, wherein each of the oscillation systems is reciprocally connected with at least one of the oscillation systems other than the own system by a coupling factor, wherein each of the oscillation systems is reciprocally connected with at least one of the oscillation systems other than the own system by a coupling factor, and wherein the entire oscillation system is prescribed by $$d^2x_j/dt^2 - \varepsilon(1-x_j^2)dx_j/dt + x_j = \sum_i g_{ji} d^2x_i/dt^2$$

or $$d^2x_j/dt^2 - \theta(1-X_j^2)dx_j/dt + X_j = 0$$

$$X_j = x_j + \sum_i g_{ji}x_i$$

where $g_j1$ is a coupling factor which is the same as the oscillation system j.

In accordance with the present invention, the oscillation system is comprised of an electrical circuit and substantially is made up of a negative resistance component, a capacitance component and an inductance component.

In accordance with another aspect of the present invention a self-excited oscillation system is provided that is comprised of a non-linear system wherein a relation among a variable x, time t, a parameter $\epsilon$, an oscillation frequency $\omega$, an externally applied input f(t) and parameters a, b for the variable x, is given by:

$$d^2x/dt^2 + \epsilon(a-x)(b-x)dx/dt + \omega^2(x-x_c) = f(t),$$

said $x_c$ is given by:

$$x_c = (a+b)/2, \text{ where } a<b.$$

In accordance with the present invention, $x_c$ is varied to control the self-excited oscillation by the external input f(t), with the changes in $x_c$ being pulsed.

In accordance with the present invention, the self-excited oscillation system is an electronic circuit in which x is an electrical voltage, $\omega$ is the frequency $1/(LC)^{1/2}$, L being an inductance component and C being a capacitance component. The inductance component and the capacitance component are reciprocally connected in series, while a negative resistance element is connected in parallel with the capacitance component. The negative resistance element is a tunnel diode. A sum voltage of the externally applied input f(t) and $x_c$ is applied across a series connected circuit comprised of the inductance component and the capacitance component.

Still another objects of the present invention will become readily apparent to those skilled in the art from the following description wherein there is shown and described a preferred embodiments of this invention, simply by way of illustration of one of the mode best suited to carry out the invention. A it will be realised, the invention is capable of other different embodiments, and its several details are capable of modifications in various, obvious aspects all without departing from the invention. Accordingly, the drawing and descriptions will be regarded as illustrative in nature and not as restrictive.

BRIEF DESCRIPTION OF THE DRAWINGS

The accompanying drawing incorporated in and forming a part of the specification, illustrates several aspects of the present invention, and together with the description serves to explain the principles of the invention.

FIG. 12(a)–12(c)is a graph showing the response of the oscillations to the parameter $x_c$ in the equation (22).

FIG. 14(a)–14(c) is a graph showing the response of the oscillations to the voltage Ec in the circuit of FIG. 13.

PREFERRED EMBODIMENTS OF THE INVENTION

According to the present invention, in plural oscillation systems the operation of each of which is described by the van der Polquation:

$$d^2x_j/dt^2 - \epsilon(1-x_j^2)dx_j/dt + x_j = 0 \quad (1)$$

each oscillation system is couped via a coupling factor (g) with at least one oscillation system other than the own system and the plural oscillation systems are described in their entirety by $$d^2x_j/dt^2 - \epsilon(1-x_j^2)dx_j/dt + x_j = \sum_i g_{ji}d^2x_i/dt^2 \quad (2)$$

or by $$d^2x_j/dt^2 - \theta(1-X_j^2)dx_j/dt + X_j = 0 \quad (3)$$

$$X_j = x_j + \sum_i g_{ji}x_i.$$

The oscillation system is made up of an electrical circuit having a substantially negative resistance component, a capacitance component and an inductance component.

The coupling factor (g) meets the following relation:

$$1 > g_{ii} \geq g_{ij}(i \neq j)$$

the parameter $\epsilon$ satisfies the relation:

$$\epsilon > 0.1$$

the synchronization system is comprised of two oscillation systems each made up of a resistance element, a capacitance element and an inductance element, these being coupled together by a negative mutual inductance (–m), with the coupling factor (g) and the parameters satisfying the following respective conditions:

$$g_{11} = g_{22}g_{12}g_{21} = m/(L_0+l+m) < 1 \quad (4)$$

and $$\epsilon = r_0\sqrt{C_0/(L_0+l+m)} > 0.1 \quad (5)$$

In a preferred embodiment of the present invention, three or more oscillation systems are arranged in an array and neighboring oscillation systems are coupled together by negative mutual inductances. If there is no neighboring oscillation system on a side of the array, respective rows and columns may be interconnected in a loop configuration.

It is also possible to arrange three or more oscillation systems in an array and to interconnect neighboring oscillation systems by negative mutual inductances. In an oscillation system in which there is no neighboring oscillation system on the rim of the array, the respective self-inductance values are adjusted so that the current values in the respective oscillation systems will be equal to one another.

For example, an oscillation system may be comprised of three oscillation systems, in which the systems having different inuctances are interconnected with respective negative mutial inductances (–m), with the coupling factor (g) and the parameter satisfying the conditions:

$$L_j = L_0 + l \quad (6)$$

$$g_{11} = g_{22}32\ g_{33} = g_{12} = g_{23} = m/(L_0+2l+m)$$

$$g_{31} = 0 \quad (7)$$

and $$\epsilon = _0\sqrt{C_0/(L_0+2l+m)} \quad (8)$$

An oscillation system may be preferably comprised of three oscillation systems interconnected by negative mutual inductances (−m), with the coupling factor (g) and the parameter satisfying the respective conditions:

$$g_{11}=g_{22}=g_{33}=g_{12}=g_{23}=g_{31}=m/(L_0+2l+m) \quad (9)$$

and $$\epsilon = r_0 \sqrt{C_0/(L_0 2l+m)} \quad (10).$$

The entire system is set into oscillations at its natural frequency, so that it is possible to realise the synchronization among the respective oscillation systems automatically to render it possible not to use the conventional forced synchronization adjustment method. With regard to an example of an integrated circuit (LSI), a synchronization system by spontaneous clock signals exhibiting high robustness against on-chip clock signal generation, non-uniform parameters of circuit elements or partial destruction of the circuit elements can be realised.

Figure 8:
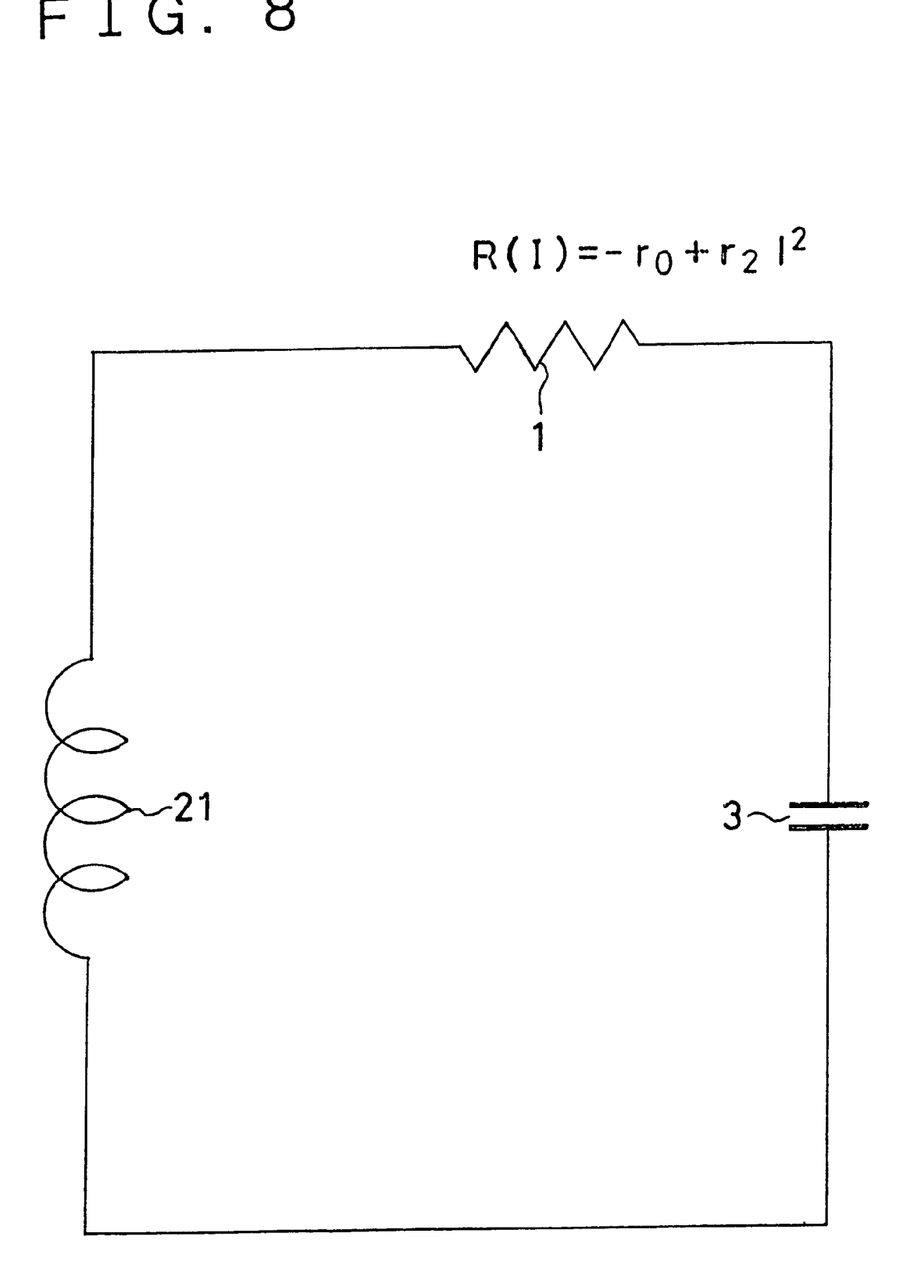
FIG. 8 shows the structure of a fundamental oscillation circuit that can be described by the val der Polquation.
Figure 9:
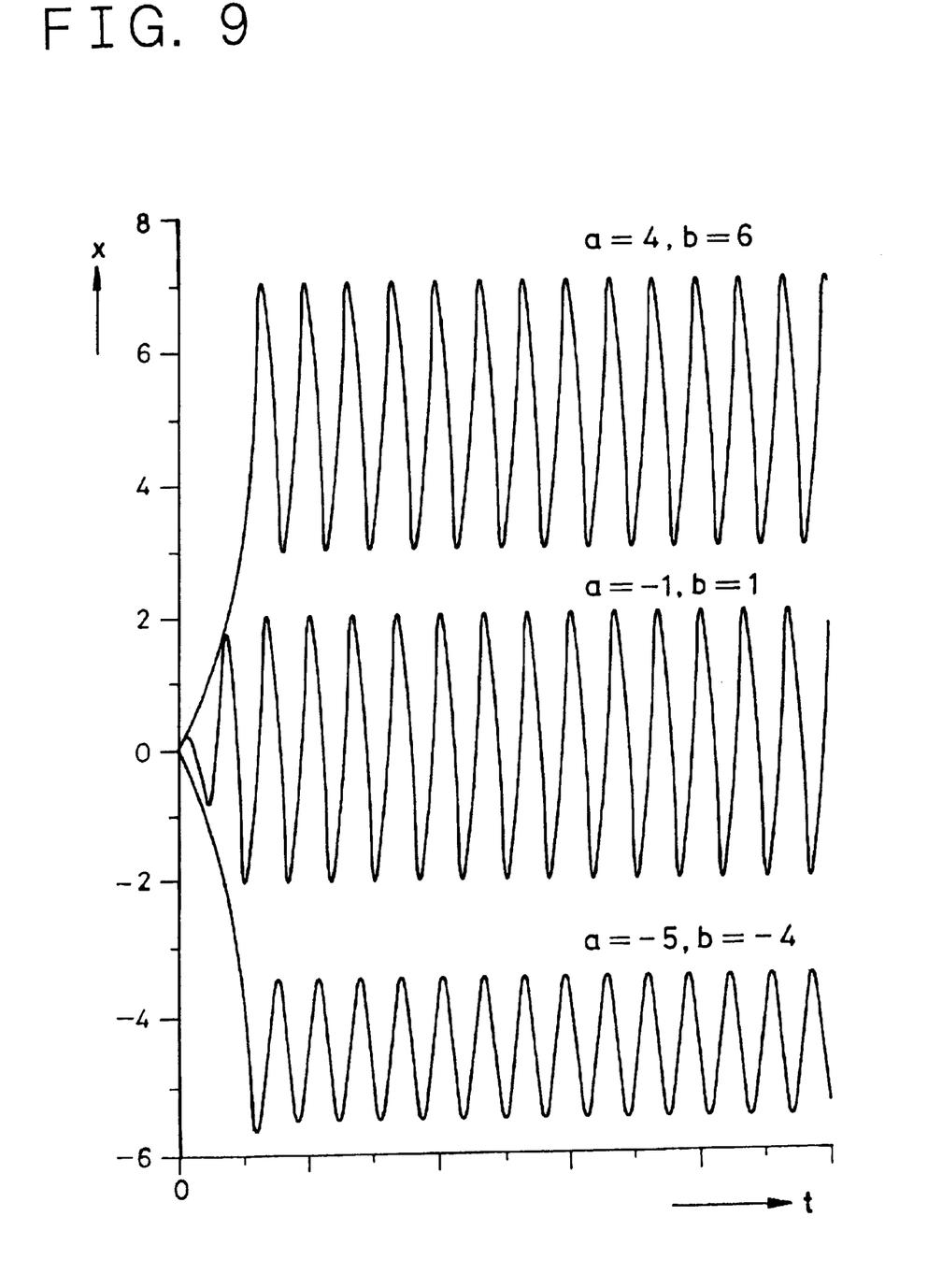
FIG. 9 is a graph showing the effect of the parameters a and b in the oscillations in the van der Pol the equation (21).

Referring to FIG. 8, a circuit j constitutes an oscillation circuit made up of a negative resistance $R(I_j)$ 1, a capacitor 3 with a capacitance $C_0$ and a coil 21 with an inductance $L_0$. $I_j$ is the current flowing in the circuit j. With the use of the electrical charge $Q_j$ of the capacitor 3, the Kirchhoffs loop equation is:

$$L_0 \frac{dI_j}{dt} + R(I_j)I_j + \frac{Q_j}{C_0} = 0. \quad (11)$$

Differentiating this equation with respect to time, we obtain a following equation (12).

$$L_0 \frac{d^2 I_j}{dt^2} + \left(R(I_j) + \frac{dR(I_j)}{dI_j} I_j\right) \frac{dI_j}{dt} + \frac{I_j}{C_0} = 0 \quad (12)$$

If a negative resistance R $(I_j)$ in the above equation (12), is assumed to be given by the following equation (13)

$$R(I_j) = -r_0 + r_2 I_j^2, \quad r_0, r_2 > 0 \quad (13)$$

and substitution of R $(I_j)$ by the right side expression of the equation (13) and variable transformations as defined in a following equation (14) are executed $$\varepsilon = r_o \sqrt{C_o/L_o} \quad (14)$$
$$I_j = \sqrt{r_o/3 r_2 x_j}$$
$$t = \sqrt{L_o C_o} \varsigma$$
$$\varsigma \to t$$

the above equation (14) is transformed to the following well-known val del Polquation:

$$d^2 j/dt^2 - \epsilon(1-x_j^2)dx_j/dt + x_j = 0 \quad (15)$$

The reference oscillation frequency of this oscillation circuit $\omega_0$ is given by the following equation (16):

$$\omega_0 = 1/\sqrt{L_0 C_0} \quad (16).$$

As a result of our perseverant researches, we have found that the equation (17):

$$d^2 x_j/dt^2 - \varepsilon(1-x_j^2)dx_j/dt + x_j = \sum_i g_{ji} d^2 x_i/dt^2 \quad (17)$$

or the equation (18):

$$X_j = x_j + \sum_i g_{ji} x_i \quad (18)$$

where $g_{jl}$ is the coupling factor of circuits j and l, represents the equation of synchronization for the coupled van der Polquation. The following conditions 1 and 2:

$$1 > g_{ii} > g_{ij}, \text{ where } i \neq j \quad \text{(condition 1)}$$

$$\epsilon > 0.1 \quad \text{(condition 2)}$$

represent sufficient conditions for realizing the synchronization.

In the synchronization equation, the all oscillation circuits in a synchronization system are coupled reciprocally by $g_{ij}$.

This condition may be relaxed by way of limitation to coupling between neighboring circuits. However, if assumed that synchronization has been realized, it is necessary to make corrections so that the current flowing in the respective circuits will be of an equal magnitude, as will be explained in the following Examples.

Although the degree-one term of the current is excluded in the negative resistance of the above equation (13), this is not absolutely necessary. The sole necessary condition is that the resistance is negative and positive for the small and large magnitudes of the current, respectively, and that there is formed a limit cycle. As a consequence, the term of the negative resistance in the above equations (17) and (18) is changed automatically.

In the following, preferred examples of a synchronization circuit that the present invention is applied will be explained with reference to the drawings.

EXAMPLE 1

Figure 1:
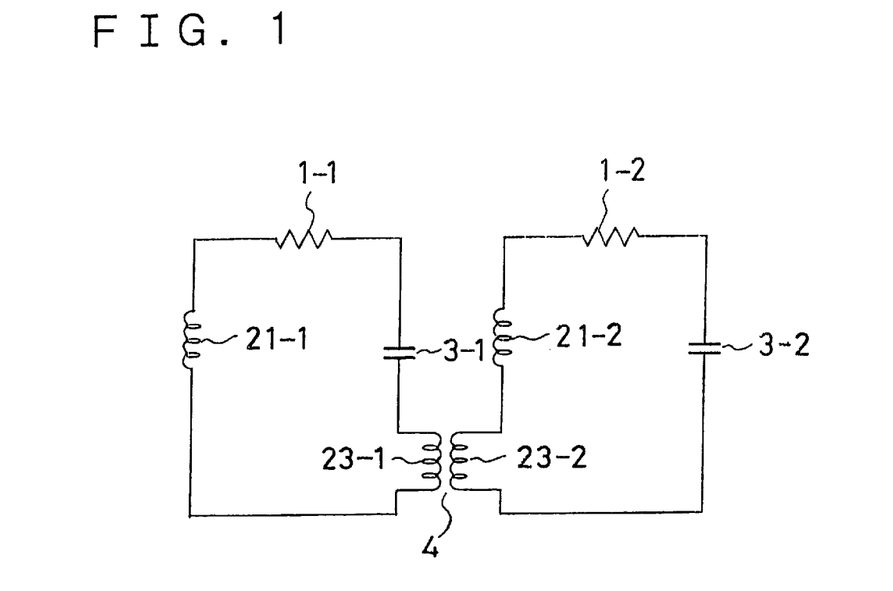
FIG. 1 shows a circuit structure of a first example of the present invention.

Referring to FIG. 1, a two oscillation circuits are interconnected by mutual inductance coils 23-1 and 23-2, having a negative mutual inductance to become a synchronization circuit satisfying the above equation (17).

With regard to parameter values for $L_0$, $l_0$ of the inductances 21, 23, the capacitance $C_0$ of the capacitor 3, the value −m of the negative inductance 4 and $r_0 + r_2 I^2$ of resistor 1, such parameters are used.

$L_0 + 7 \times 10^{-2}$ H, $l = 7 \times 10^{-2}$ H, $m = 6 \times 10^{-2}$ H, $C_0 = 200$ μF, $r_0 = 10$ Ω and $r_2 = 3.333 \times 10^2$ Ω/A$^2$, The resulting reference oscillation frequency becomes $\omega_0 = 500$ rad/sec, with $g_{11} = g_{22} = g_{12} = g_{21} = 0.3$ and $\epsilon = 1$.

Figure 2:
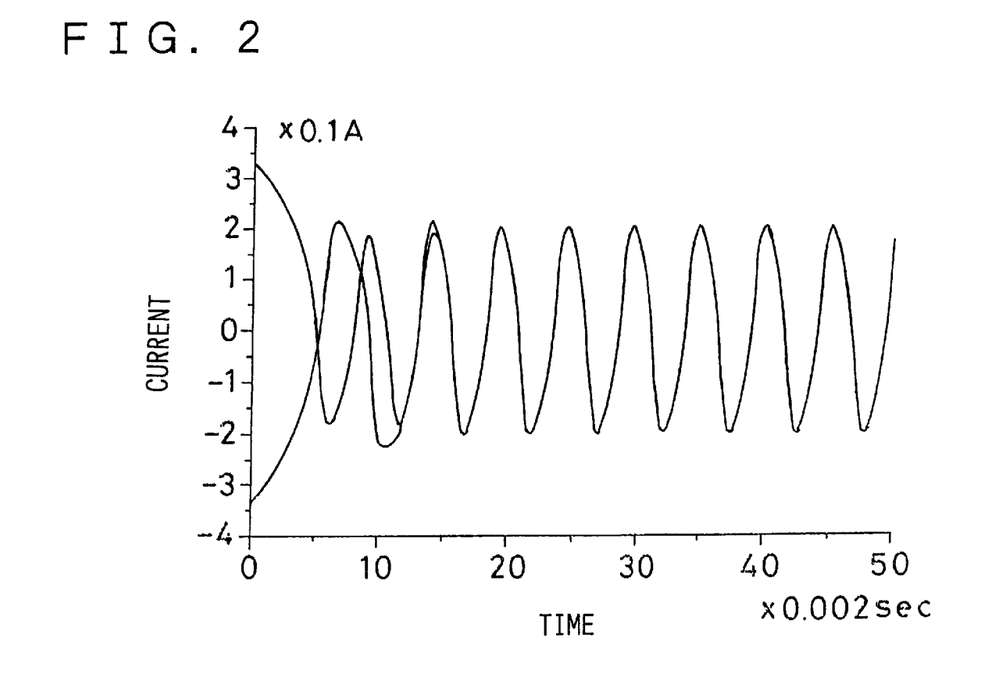
FIG. 2 shows a signal waveform showing the results of synchronization of the first example of the present invention.

FIG. 2 illustrates waveforms of the synchronization process of the two oscillation circuits shown in FIG. 1. From FIG. 2, it is seen that the current oscillations of the two oscillation circuits, started with arbitrary different initial states, are synchronized at t to 15 (unit: 0.002 sec).

EXAMPLE 2

Figure 3:
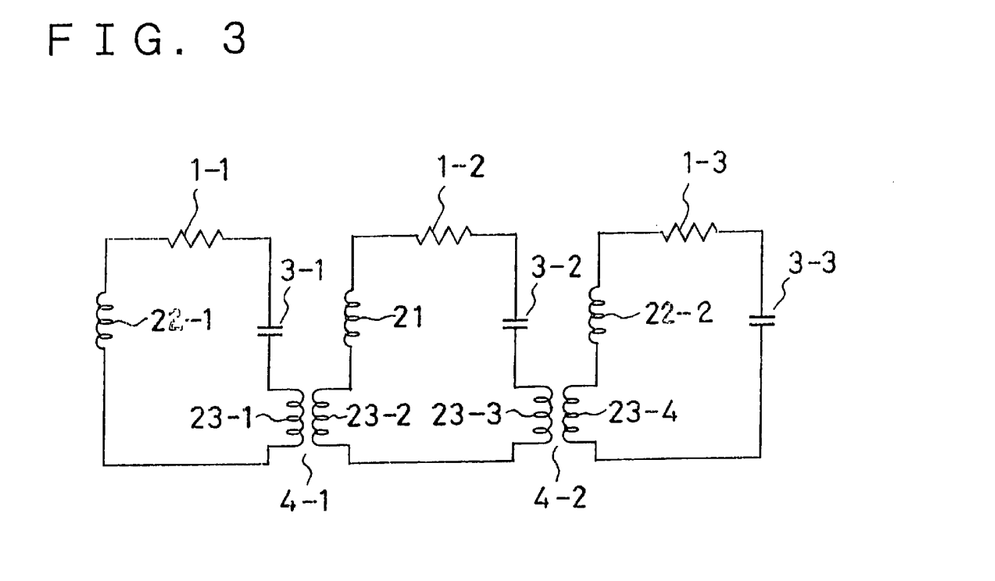
FIG. 3 shows a circuit structure of a second example of the present invention.

Reffering to FIG. 3, three oscillation circuits are interconnected by mutual inductance coils having negative mutual inductance, and the resulting circuit is the synchronization circuit satisfying the equation (17).

As parameters, $L_0=2\times10^{-2}$ H, $l=6\times10^{-2}$ H, $m=6\times10^{31\,2}$ H, $L_1=8\times10^{-2}$ H, $C_0=200$ μF, $r_0=10$ Ω and $r_2=3.333\times10^2$ Ω/A$^2$ are used as parameters, and the resulting reference oscillation frequency becomes $\omega_0=500$ rad/sec, with $g_{11}=g_{22}=g_{33}=g_{12}=g_{23}=0.3$, $g_{31}=0$ and $\epsilon=1$, where $L_1$ is the value of the inductances 22-1, 22-2 of both end oscillation circuit of FIG. 3.

Figure 4:
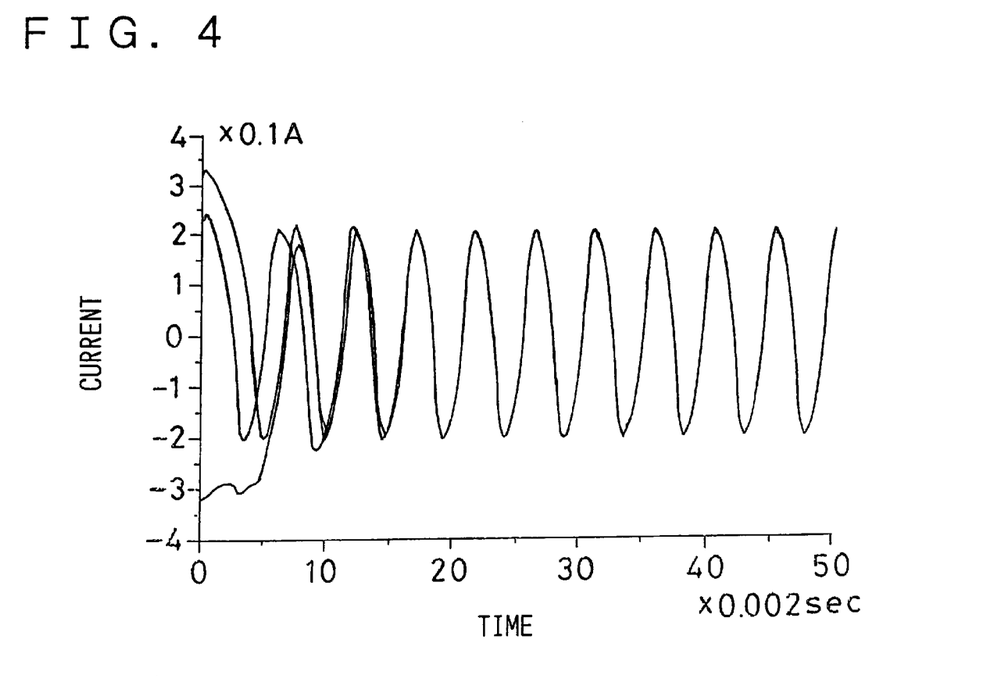
FIG. 4 shows a signal waveform showing the results of synchronization of the second example of the present invention.

It is assumed that circuits arranged in both sides compensate for difference from the central circuit. An example of synchronization in this case in shown in FIG. 4. The result off FIG. 4 is that the current oscillations of three oscillation circuits, started with arbitrary different initial states (t=0), are synchronized at time 20 (unit: 0.002 sec).

EXAMPLE 3

Figure 5:
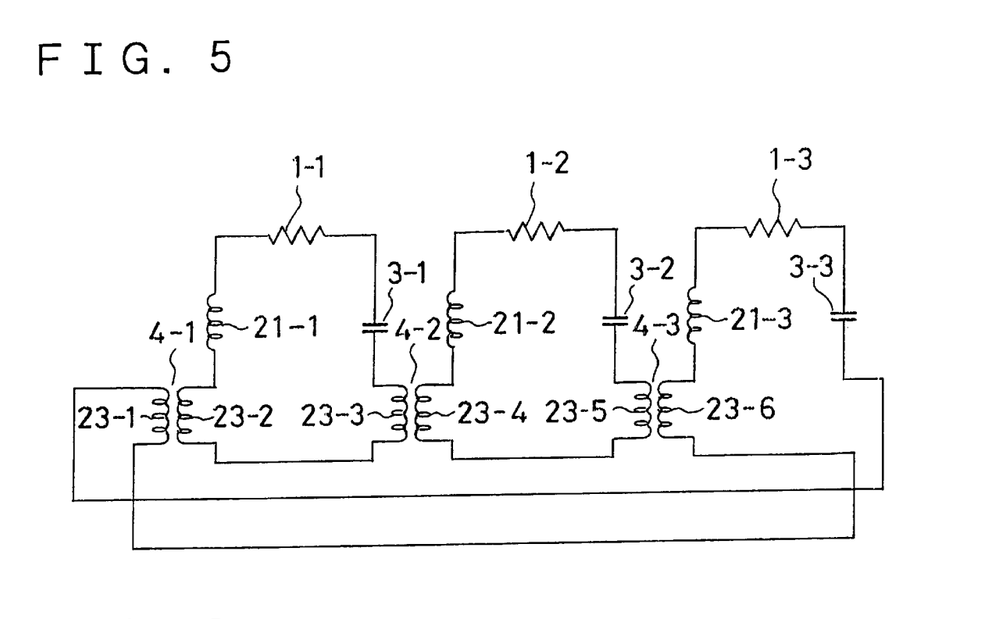
FIG. 5 shows a circuit structure of a third example of the present invention.

Referring to FIG. 5, three oscillation circuits are interconnected by mutual inductance coils having negative mutual inductances, the resulting circuit is the synchronization circuit satisfying the equation (17). An oscillation circuit at an end of an array is connected to the opposite end oscillation circuit with mutual inductance coils 23-1, 23-2 having negative mutual inductances.

Figure 6:
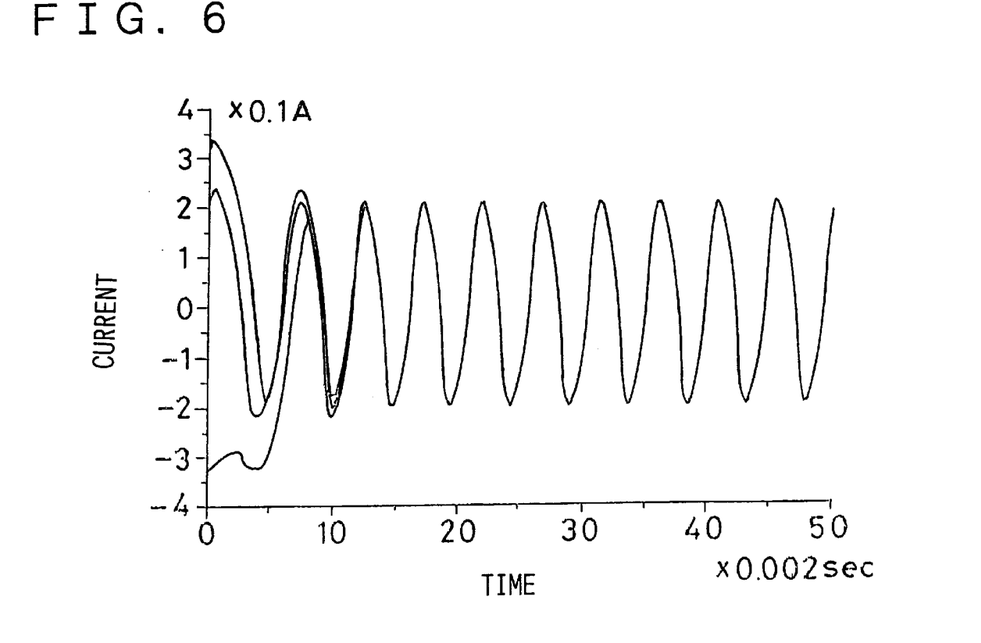
FIG. 6 shows a signal waveform showing the results of synchronization of the third example of the present invention.

As parameters, $L_0=2\times10^{-2}$ H, $l=6\times10^{-2}$ H, $m=6\times10^{-2}$ H, $C_0=200$ μF, $r_0=10$ Ω and $r_2=3.333\times10^2$ Ω/A$^2$ are used, and 5 resulting the reference oscillation frequency is $\omega_0=500$ rad/sec, with $g_{11}=g_{22}=g_{33}=g_{12}=g_\leq=g_{31}=0.3$, and $\epsilon=1$ In this case, the totality of the circuits are equated, such that correction of both ends as is done in Example 2 is unnecessary. An example of synchronization of the present Example is shown in FIG. 6, from which it is seen that the current oscillations of the three oscillation circuits, started with arbitrary different initial states, are synchronized at t to 15 (unit: 0.002 sec).

EXAMPLE 4

Figure 7:
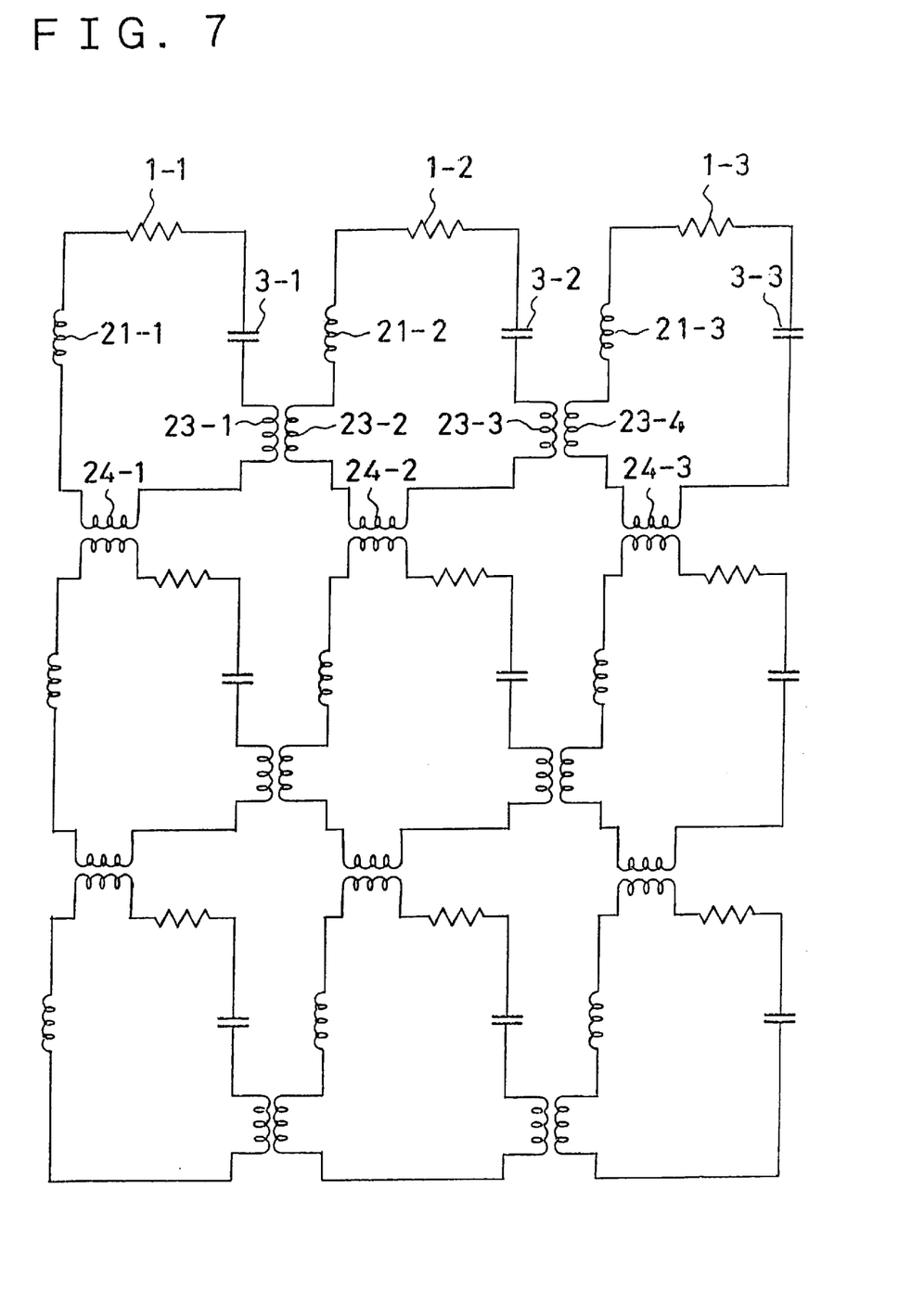
FIG. 7 shows a circuit structure of a fourth example of the present invention.

A circuit comprised of nine oscillation circuits interconnected by mutual inductance coils having negative inductances is shown in FIG. 7.

If this circuit is to be a synchronization circuit satisfying the equation (17), both end oscillation circuits need to be connected as in Example 3, or correction at both ends as in Example 2 is required. For correction, the value of the self-inductance is selected to render the current values in the respective circuits equal when synchronization is achieved.

Although the inductance effect is used as the coupling factor in the above Examples, capacitance effects may also be used, if so desired.

As described above, if the entire system is constituted by a set of plural sub-sets, and synchronization needs to be achieved between different sub-systems, the synchronization of the respective synchronization circuits can be automatically realized, such that the entire system can be spontaneously tuned, with the result that the conventional forced synchronization adjustment method no longer needs to be used. For example, if the present invention is applied to an integrated circuit, it is possible to realize high robustness of spontaneous clock signals against on-chip clock generation, non-uniform circuit element parameters or partial destruction.

The operation of the another asppect of the present invention is explained. The van der Polquation, a well-known equation of the self-excited oscillation circuit, is generalized and a variable x is changed to enable on/off control of the self-excited oscillations by the external input. For example, it has been found that the self-excited oscillations can be on/off controlled by varying an applied voltage x as a variable in an electric oscillation circuit. The on/off control of the self-excited oscillations can be realised readily solely by controlling this applied voltage.

An equation of a non-linear self-excited oscillation system is written as $$d^2x/dt^2+\omega^2x=\epsilon f(x,\,dx/dt) \tag{19}$$

where x, t, ω and ε denote a variable, time, proper oscillation frequency and a parameter used for controlling the degree of non-linearity, respectively.

The van der Polquation in the non-linear self-excited oscillation system, indicated by the above equation (1), is expressed in a simple form of $$d^2x/dt^2-\epsilon(1-x^2)\cdot dx/dt+\omega^2x=0 \tag{20}$$

This van der Polquation (20) can be modified to a following equation (21).

$$d^2x/dt^2+\epsilon(a-x)(b-x)\cdot dx/dt+\omega^2\{x-(a+b)/2\}=0 \tag{21}$$

where a and b are optional parameters in the variable x, to enable the equation (20) to be used in a more expanded fashion. Of course, if a=−1 and b=1 in the equation (21), the result is the above equation (20).

The above equation (21) indicates that the center of the oscillations is variable between x=0 and x=(a+b)/2, and that the amplitude is a function of (b−a).

However, the equation (21) is after all the equation of the self-excited oscillation system such that it cannot control the excited oscillations as targeted by the present invention. Therefore, as the next step, $x_c=(a+b)/2$ is set in the above equation (21). Then, the equation (21) is set to be a following equation (22).

$$d^2x/dt^2+\epsilon(a-x)(b-x)\cdot dx/dt+\Omega^2\{x-x_c\}=0 \tag{22}$$

Figure 10:
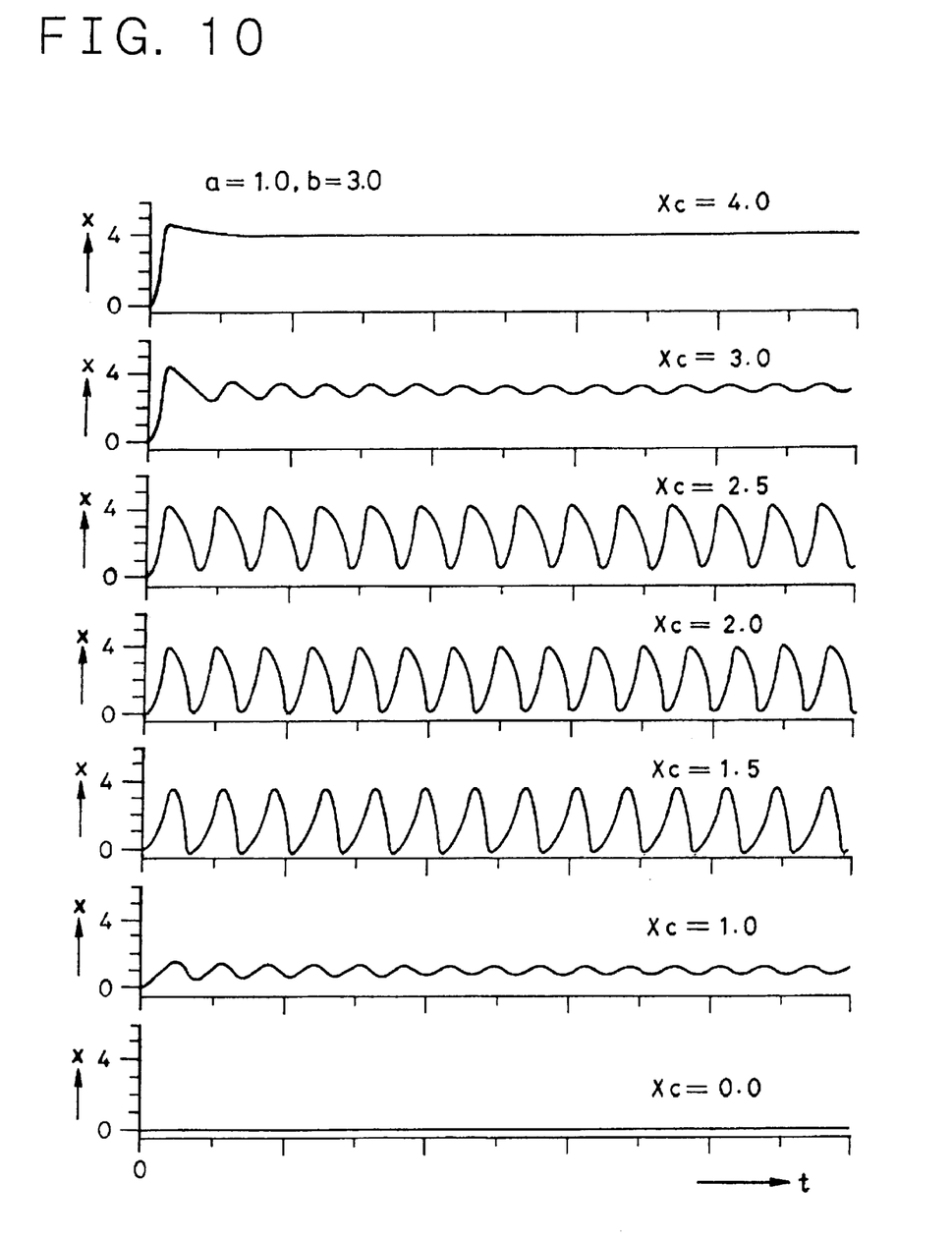
FIG. 10 is a graph showing the mode of excitation control by the parameter $x_c$ in the equation (22).

FIG. 10 shows that this xc operates as a threshold parameter for excitation, termed herein the excitation threshold parameter. That is, if, in FIG. 10, $x_c$ is shifted in an increasing or decreasing direction about (a+b)/2=(1.0+3.0)/2=2.0 as a center, the oscillation is terminated.

For further clarifying the usefulness of the equation (22), f(t) is defined as a bias function to give the following equation (23).

$$d^2x/dt^2+\epsilon(a-x)(b-x)\cdot dx/dt+\Omega^2\{x-x_c\}=f(t)\ldots\backslash|\Sigma)$$

Figure 11:
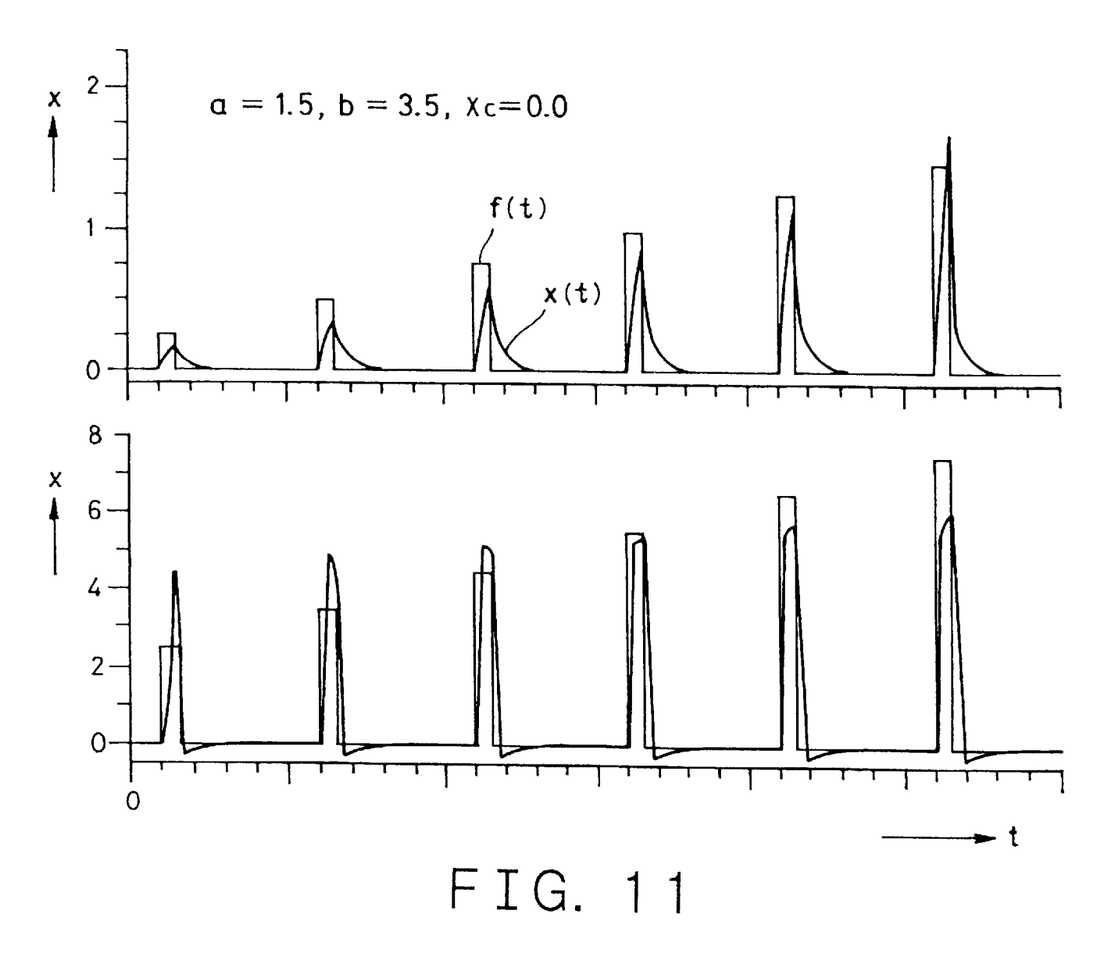
FIG. 11 is a graph showing the response of the oscillations by the bias function f(t) in the equation (22).

In FIG. 11 showing the presence of the excitation threshold parameter and spike occurrence, thick and thin lines indicate x(t) and f(t), respectively.

Figure 12A:
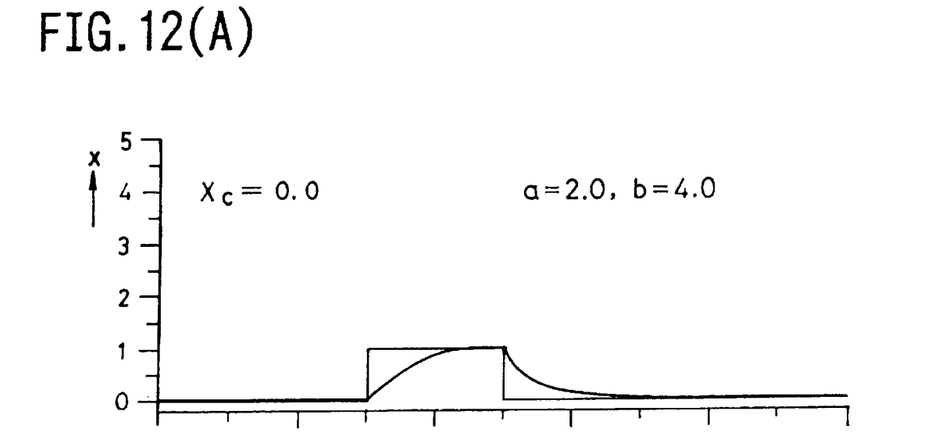
Figure 12B:
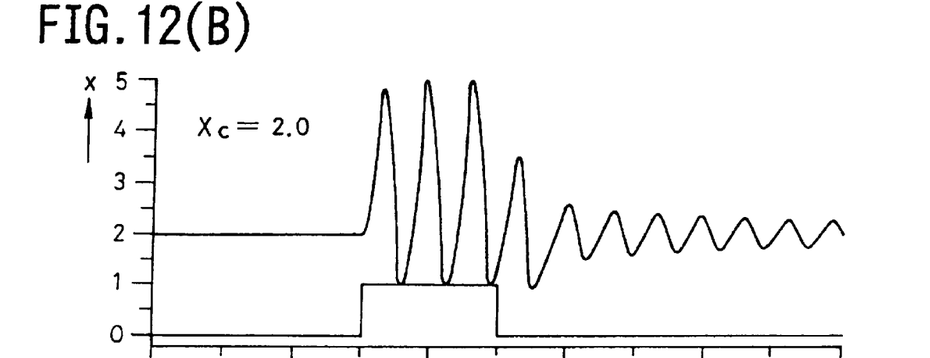
Figure 12C:
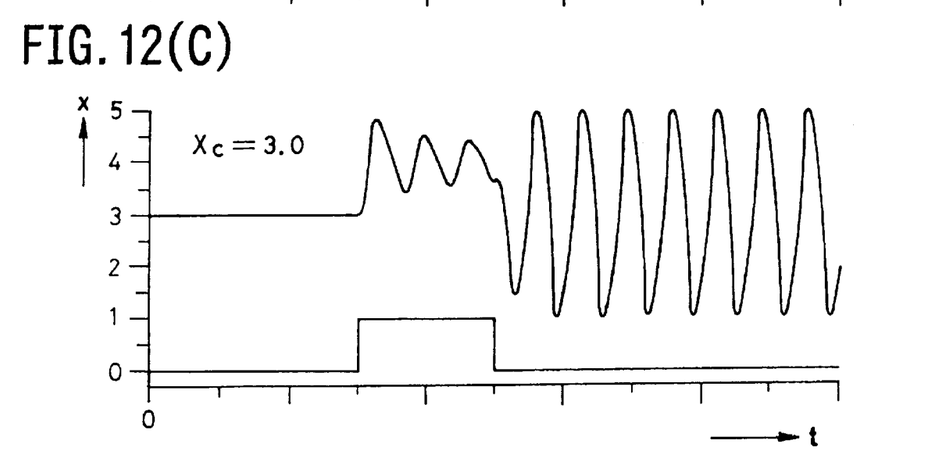

Reference to FIG. 12 indicates that, for a=2.0 and b=4.0, the response of the oscillations to the same f(t) is changed with changes in $x_c$. FIG. 12A shows x(t) for xc=0.0, with there being produced no oscillations. FIG. 12B shows x(t) for $x_c=2.0$. It is seen that, since $x_c$ is equal to (a+b)/2, oscillations are started on application of f(t), and are attenuated on cessation of application of f(t). Also, FIG. 12C shows x(t) for $x_c=3.0$. It is seen that oscillations are started on application of f(t), and are maintained even on cessation of application of f(t).

Figure 13:
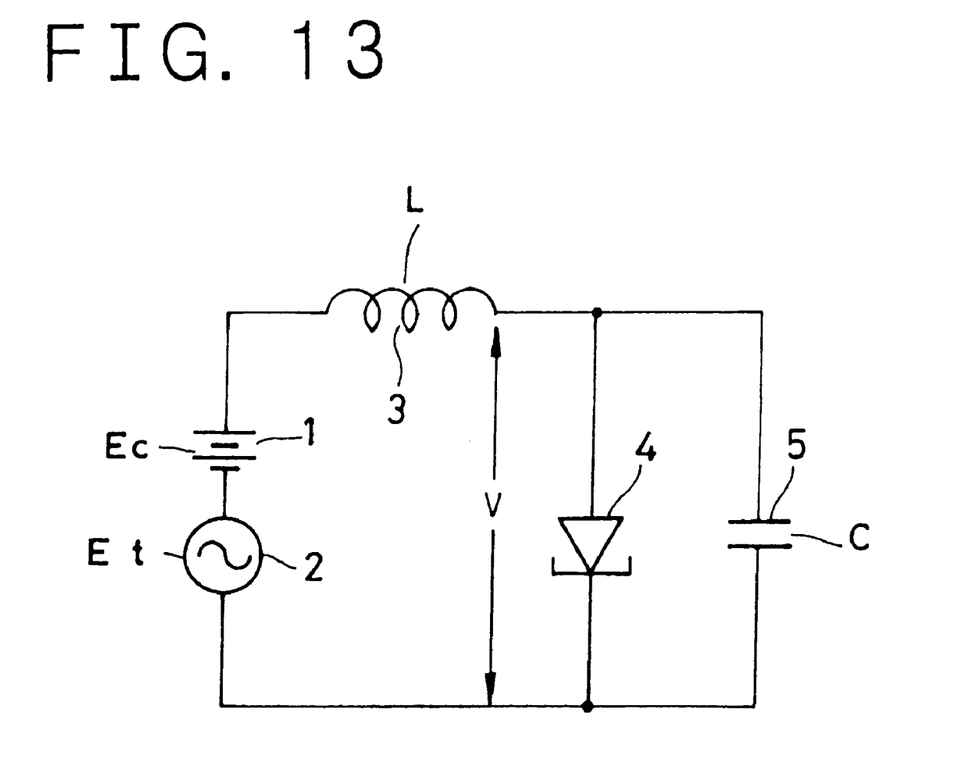
FIG. 13 shows an example of an electronic oscillation circuit embodying the present invention.

Referring to FIG. 13, an example of an oscillation circuit is explained. The oscillation circuit, shown in FIG. 13, is made up of a diode 4 having current-voltage characteristics (I=f(V)), a capacitor 5 (capacitance C), a coil 3 (inductance L) and a power source 1 (voltage Ec). The coil 3 and the capacitor 5 are connected reciprocally in series, and a diode 4 is connected in parallel with the capacitor 5, while a power source voltage Ec is applied across a series circuit of the coil and the capacitor. Meanwhile, E(t) denotes an external voltage source operating as a bias function. This external voltage source is operated as a bias function and is provided in series with the power source Ec. It is noted that I and V denote the current flowing in the circuit and the voltage applied across the diode 4, respectively.

If, in the above configuration, the Kirchhoff's loop equation is applied, we obtain a following equation (24).

$$d^2V/dt^2 + (1/C) \cdot f'(V) \cdot dx/dt + 1/(LC) \cdot \{V - Ec - E(t)\} = 0 \quad (24)$$

where f'(V)=df(V)/dV and E(t) is an external voltage.

If f' (V) is approximated to κ(Va−V)(Vb−V), the equation (24) can be rewritten in a form of a following equation (25).

$$d^2V/dt^2 + (\kappa/C) \cdot (Va-V)(Vb-V) \cdot dx/dt + 1/(LC) \cdot (V-Ec) = 1/(LC) \cdot E(t) \quad (25)$$

If, in the equation (25), Ec=(Va+Vb)/2 and E(t)=0, the well-known van der Polquation (20) is obtained after appropriate variable conversion.

Figure 14A:
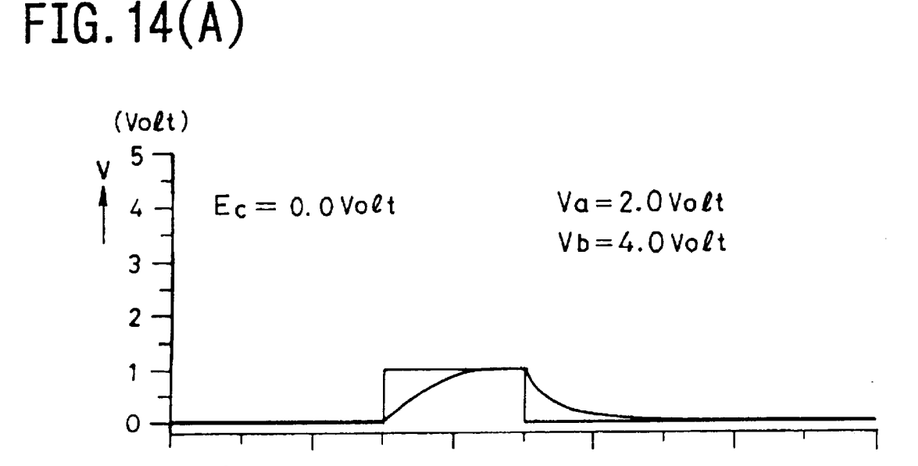
Figure 14B:
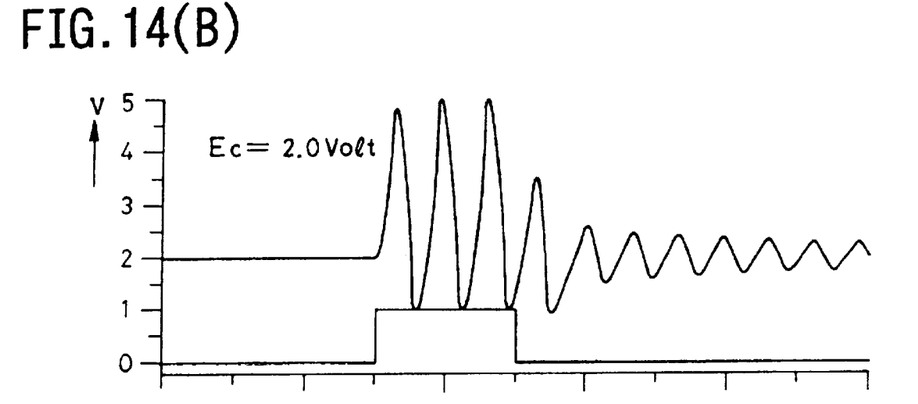
Figure 14C:
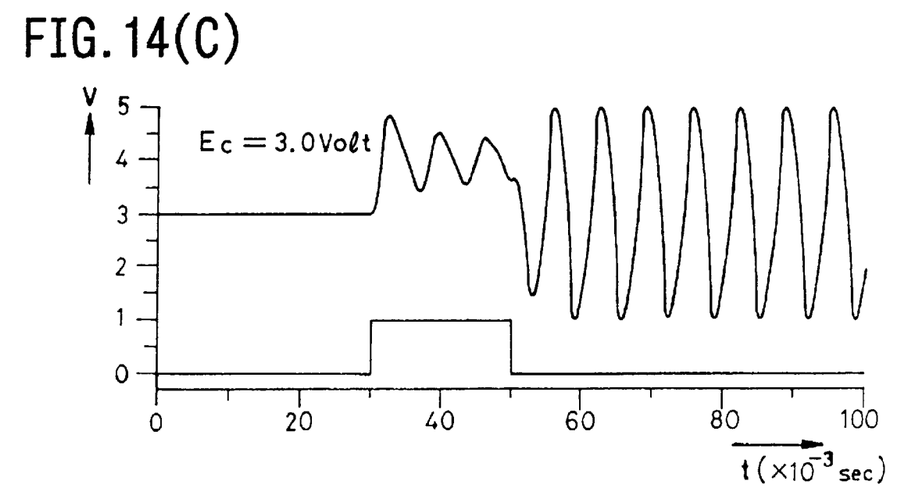

Thus, in the oscillation circuit shown in FIG. 13, oscillation on/off control is possible by shifting the value of Ec by increasing or decreasing it from (Va+Vb)/2 as the excitation threshold parameter, as discussed previously with reference to FIG. 12. This state is shown in FIG. 14. FIG. 14, corresponding to FIG. 12, shows the oscillation response to the voltage Ec for Va=2.0 V and Vb=4.0. Specifically, FIGS. 14A, 14B and 14C indicate the frequency response to the voltages Ec of 0.0 V, 2.0 V and 3.0 V, respectively. The external input voltage E(t) as the bias function is pulsed, such that, if this is superimposed on Ec, Ec is varied in a pulsed fashion to enable oscillation on/off control.

Figure 15:
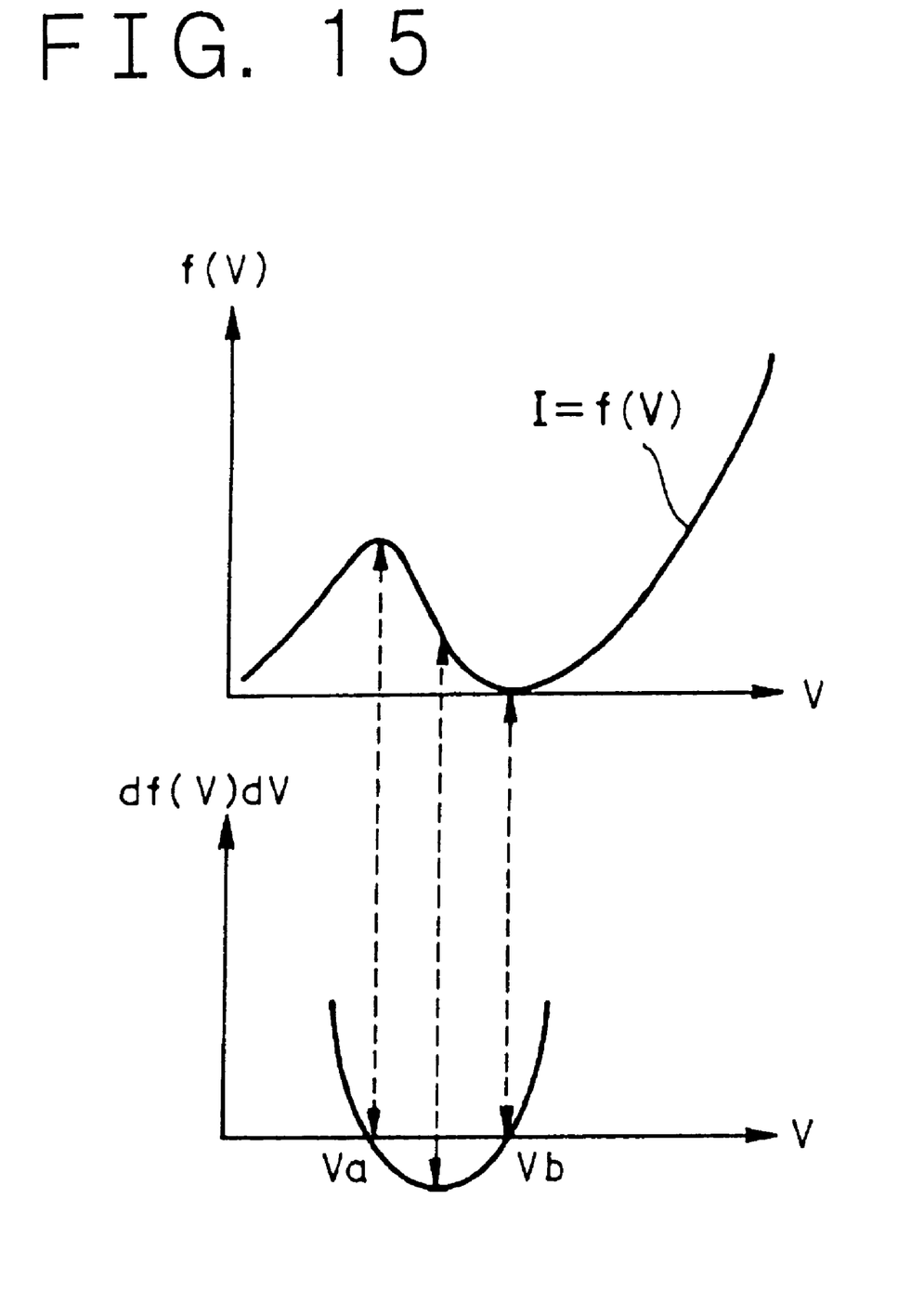
FIG. 15 is a graph, showing voltage/current characteristics in a tunnel diode in the circuit of FIG. 13.

If, in FIG. 13, a diode 4, configured as a tunnel diode exhibiting negative resistance characteristics, as shown in FIG. 15, is connected in parallel with the capacitor 5, and Va, Vb are 2 V and 4 V, respectively, with the excitation threshold parameter Ec is equal to (Va+Vb)/2=3 V. Meanwhile, the capacitance C is 200 μF and the inductance L is 2×10⁻²H, with the reference number of oscillations ω being 500 rad/sec.

In the above-described example, the self-excited oscillation system is implemented by an electronic circuit. The self-excited oscillation system may, however, be implemented by a mechanism other than the electronic circuit, such as by a mechanical system, exemplified gy a spring, a damper or a frictional mechanism. Therefore, the present invention is applicable not only to the system constituting components, that is to an electronic circuit, but to a wide variety of automatic oscillation excitation systems at large.

As described in the above, pre-set parameters of the self-excited oscillation system are used as control signals to effect on/off oscillation control, there is obtained an effect comparable to addition of a switch despite the simplified configuration.

It should be noted that other objects of the present invention will become apparent in the entire disclosure and that modifications may be done without departing the gist and scope of the present invention as disclosed herein and appended herewith.

Also it should be noted that any combination of the disclosed and/or claimed elements, matters and/or items may fall under the modifications aforementioned.

What is claimed is:

1. A synchronization system comprising a plurality of oscillation systems, each having its operation prescribed by the van der Pol equation:

$$d^2x_j/dt^2 - \epsilon(1-x_j^2)dx_j/dt + x_j = 0 \quad (1)$$

where x, t and ε denote a variable, time and a parameter respectively, wherein each of said oscillation systems is reciprocally connected with at least one of said oscillation systems other than the own system by a coupling factor; and in that the entire oscillation system is prescribed by $$d^2x_j/dt^2 - \varepsilon(1-x_j^2)dx_j/dt + x_j = \sum_i g_{ji} d^2 x_i/dt^2 \quad (2)$$

or $$X_j = x_j + \sum_i g_{ji} x_i \quad (3)$$

where $g_{ji}$ is a coupling factor which is the same as the oscillation system j.

2. The synchronization system as defined in claim 1 wherein the oscillation system is comprised of an electrical circuit.

3. The synchronization system as defined in claim 2 wherein said electrical circuit substantially includes a negative resistance component, a capacitance component and an inductance component.

4. The synchronization system as defined in any one of claims 1 to 3 wherein said coupling factor g satisfies the condition of 1

$$1 > g_{ii} \geq g_{ij} (i \neq j).$$

5. The synchronization system as defined in claim 4 wherein said parameter ε satisfies the relation of ε>0.1.

6. The synchronization system as defined in claim 4 comprising two oscillation systems each being made up of a resistance element R, a capacitance element $C_0$ and an inductance element $L_0$ coupled together via a negative mutual inductance (−m), said coupling element (g) and the parameter (e) satisfying the conditions:

$$g_{11}=g_{22}g_{12}g_{21}=m/(L_0+l+m)<1 \quad (4)$$

and $$\epsilon = r_0 \sqrt{C_0/(L_0+l+m)} > 0.1 \quad (5)$$

7. The synchronization system as defined in claim 4 wherein three or more oscillation systems are arranged in an array, with neighboring oscillation systems being coupled together by a negative mutual inductance;

wherein in an oscillation system on a rim of said array where there is no neighboring oscillation system, the self-inductance is adjusted to render the current value modes in said plural oscillation systems equal to one another.

8. The synchronization system as defined in claim 4 wherein three or more oscillation systems are arranged in an array, with neighboring oscillation systems being coupled together by a negative mutual inductance;

wherein an oscillation system located on a side of said array where there is no neighboring oscillation system is connected in a loop to an oscillation system located on the opposite side of the array.

9. The synchronization system as defined in any one of claims 1 to 3 wherein said parameter ε satisfies the relation of ε>0.1.

10. The synchronization system as defined in claim 9 comprising two oscillation systems each being made up of a resistance element R, a capacitance element $C_0$ and an inductance element $L_0$ coupled together via a negative mutual inductance (−m), said coupling element (g) and the parameter (ϵ) satisfying the conditions:

$$g_{11}=g_{22}g_{12}g_{21}=m/(L_0+l+m)<1 \qquad (4)$$

and $$\epsilon=r_0\sqrt{C_0/(L_0+l+m)}>0.1 \qquad (5)$$

11. The synchronization system as defined in claim 9 wherein three or more oscillation systems are arranged in an array, with neighboring oscillation systems being coupled together by a negative mutual inductance;
wherein in an oscillation system on a rim of said array where there is no neighboring oscillation system, the self-inductance is adjusted to render the current value modes in said plural oscillation systems equal to one another.

12. The synchronization system as defined in claim 9 wherein three or more oscillation systems are arranged in an array, with neighboring oscillation systems being coupled together by a negative mutual inductance;
wherein an oscillation system located on a side of said array where there is no neighboring oscillation system is connected in a loop to an oscillation system located on the opposite side of the array.

13. The synchronization system as defined in any one of claims 1 to 3 comprising two oscillation systems each being made up of a resistance element R, a capacitance element $C_0$ and an inductance element $L_0$ coupled together via a negative mutual inductance (−m), said coupling element (g) and the parameter (ϵ) satisfying the conditions:

$$g_{11}=g_{22}g_{12}g_{21}=m/(L_0+l+m)<1 \qquad (4)$$

and $$\epsilon=r_0\sqrt{C_0/(L_0+l+m)}>0.1 \qquad (5)$$

14. The synchronization system as defined in any one of claims 1 to 3 wherein three or more oscillation systems are arranged in an array, with neighboring oscillation systems being coupled together by a negative mutual inductance;
wherein in an oscillation system on a rim of said array where there is no neighboring oscillation system, the self- inductance is adjusted to render the current value modes in said plural oscillation systems equal to one another.

15. The synchronization system as defined in claim 14 comprising three oscillation systems, wherein the systems having different inductance values are reciprocally coupled by respective negative mutual inductances (−m), said coupling factor (g) and the parameter (ϵ) satisfying the following conditions:

$$L_f=L_0+l \qquad (6)$$

$$g_{11}=g_{22}32 \; g_{33}=g_{12}=g_{23}=m/(L_0+2l+m)$$

$$g_{31}=0 \qquad (7)$$

and $$\epsilon=_0\sqrt{C_0/(L_0+2l+m)} \qquad (8)$$

16. The synchronization system as defined in any one of claims 1 to 3 wherein three or more oscillation systems are arranged in an array, with neighboring oscillation systems being coupled together by a negative mutual inductance;
wherein an oscillation system located on a side of said array where there is no neighboring oscillation system is connected in a loop to an oscillation system located on the opposite side of the array.

17. The synchronization system as defined in claim 14 comprising three oscillation systems reciprocally coupled together by negative mutual inductances (−m), said coupling factor (g) and the parameter satisfying the conditions:

$$g_{11}=g_{22}=g_{33}=g_{12}=g_{23}=g_{31}=m/(L_0+2l+m) \qquad (9)$$

and $$\epsilon=r_0\sqrt{C_0/(L_0 2l+m)} \qquad (10).$$

18. A self-excited oscillation system comprising a non-linear system wherein a relation among a variable x, time t, a parameter ϵ, a oscillations frequency ω, an externally applied input f(t) and parameters a, b for the variable x, is given by:

$$d^2x/dt^2+\epsilon(a-x)(b-x)dx/dt+\omega^2(x-x_c)=f(t),$$

said $x_c$ is given by:

$$x_c=(a+b)/2, \text{ where } a<b.$$

19. The self-excited oscillation system as defined in claim 18 wherein a self-excited oscillation by said external input f(t) is controlled by varying said $x_c$ such as by shifting said $x_c$ from (a+b)/2.

20. The self-excited oscillation system as defined in claim 19 wherein the changes in $x_c$ are in a form of pulse shape.

21. The self-excited oscillation system as defined in any one of claims 18 to 20, wherein the system is an electronic circuit wherein x is a voltage and ω is a frequency $1/(LC)^{1/2}$, being an inductance component and C being a capacitance component.

22. The self-excited oscillation system as defined in claim 21 wherein said inductance component and the capacitance component are reciprocally connected in series.

23. The self-excited oscillation system as defined in claim 22, wherein a sum voltage of said externally applied input f(t) and $x_c$ is applied across a series connected circuit comprised of said inductance component and the capacitance component.

24. The self-excited oscillation system as defined in claim 22 wherein a negative resistance element is connected in parallel with said capacitance component.

25. The self-excited oscillation system as defined in claim 24, wherein a sum voltage of said externally applied input f(t) and $x_c$ is applied across a series connected circuit comprised of said inductance component and the capacitance component.

26. The self-excited oscillation system as defined in claim 24 wherein said negative resistance element is a tunnel diode.

27. The self-excited oscillation system as defined in claim 26, wherein a sum voltage of said externally applied input f(t) and $x_c$ is applied across a series connected circuit comprised of said inductance component and the capacitance component.

* * * * *